US011952280B2

(12) United States Patent
Lashmore et al.

(10) Patent No.: US 11,952,280 B2
(45) Date of Patent: Apr. 9, 2024

(54) SYNTHESIS OF QUANTUM CARBON NANOTUBES

(71) Applicant: American Boronite Corporation, Burlington, MA (US)

(72) Inventors: David S. Lashmore, Lebanon, NH (US); Pavel Bystricky, Lexington, MA (US); Susanthri Chandima Perera, Cohoes, NY (US); Imre Tary, Leominster, MA (US); Vito M. Licata, Saugus, MA (US)

(73) Assignee: American Boronite Corporation, Burlington, MA (US)

( * ) Notice: Subject to any disclaimer, the term of this patent is extended or adjusted under 35 U.S.C. 154(b) by 371 days.

(21) Appl. No.: 16/795,461

(22) Filed: Feb. 19, 2020

(65) Prior Publication Data

US 2020/0262706 A1    Aug. 20, 2020

Related U.S. Application Data

(60) Provisional application No. 62/807,548, filed on Feb. 19, 2019.

(51) Int. Cl.
*B32B 9/00* (2006.01)
*C01B 32/162* (2017.01)
(Continued)

(52) U.S. Cl.
CPC .......... *C01B 32/162* (2017.08); *C01B 32/168* (2017.08); *D01F 9/12* (2013.01);
(Continued)

(58) Field of Classification Search
CPC ....... B32B 9/007; Y10T 428/30; B82Y 30/00; C23C 16/26; Y10S 977/742
(Continued)

(56) References Cited

U.S. PATENT DOCUMENTS

| 7,022,541 B1* | 4/2006 | Yenilmez | B82Y 35/00 |
| | | | 438/52 |
| 2010/0081568 A1* | 4/2010 | Bedworth | B01J 37/0219 |
| | | | 502/150 |

(Continued)

*Primary Examiner* — Daniel H Miller
(74) *Attorney, Agent, or Firm* — Greenberg Traurig LLP; Chinh Pham; Joshua Rudawitz

(57) ABSTRACT

The present disclosure provides systems and methods for producing a volume of substantially all armchair nanotubes of a preselected chirality for fabricating yarn consisting of substantially all metallic conducting armchair tubes. The systems and methods can be used for the synthesis of (10,10), (11,11), and (12,12) metallic armchair carbon nanotubes and potentially other chiralities. The elements of the present disclosure include: (i) a carbon source that provides substantial numbers of ethylene and acetylene radicals in combination with a high population of ethylene groups and a small amount of methane, (ii) a hydrogen to carbon ratio sufficient to "passivate" all other chiral growth sites to a higher degree than armchair growth sites, and (iii) a CVD process that can be tuned to create a well-controlled population of catalyst with tight diameter distribution with sparse modal distribution that falls within a range of the desired single wall diameters.

13 Claims, 8 Drawing Sheets

(51) Int. Cl.
*C01B 32/168* (2017.01)
*D01F 9/12* (2006.01)
*D01F 13/00* (2006.01)
*H05K 9/00* (2006.01)

(52) U.S. Cl.
CPC ............. *D01F 13/00* (2013.01); *H05K 9/009* (2013.01); *C01B 2202/22* (2013.01); *C01B 2202/26* (2013.01); *C01B 2202/36* (2013.01); *C01P 2002/82* (2013.01); *Y10T 428/30* (2015.01)

(58) Field of Classification Search
USPC ................................ 428/408; 423/448, 447.1
See application file for complete search history.

(56) References Cited

U.S. PATENT DOCUMENTS

| | | | | |
|---|---|---|---|---|
| 2011/0111577 A1* | 5/2011 | Choi | ...................... | C01B 32/162 |
| | | | | 438/478 |
| 2011/0262772 A1* | 10/2011 | Hauge | ................... | B82Y 40/00 |
| | | | | 428/688 |
| 2013/0165011 A1* | 6/2013 | Liu | ........................ | B82Y 10/00 |
| | | | | 445/50 |
| 2013/0309473 A1* | 11/2013 | Sundaram | .............. | B01J 37/086 |
| | | | | 428/338 |

* cited by examiner

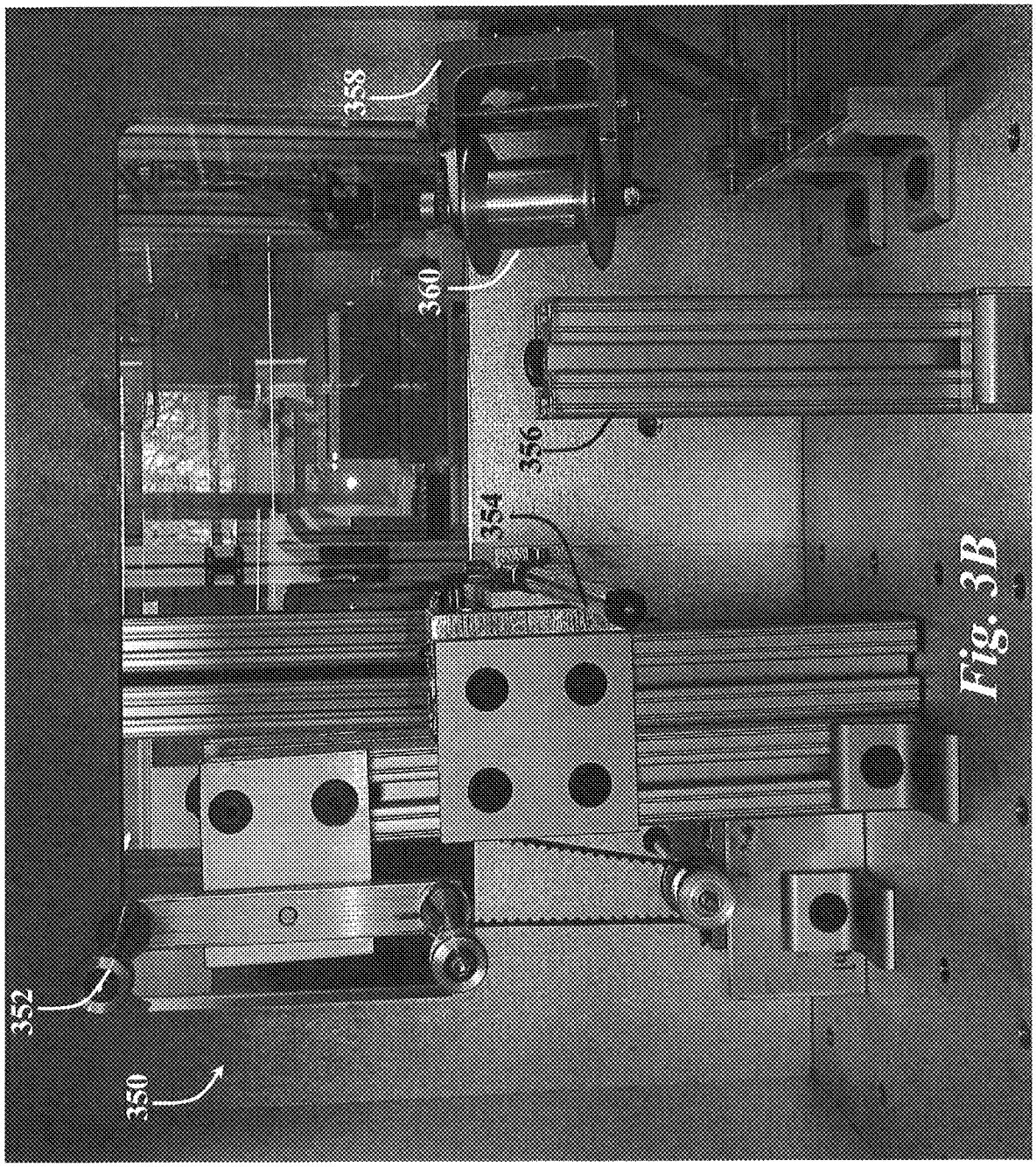

SYNTHESIS OF QUANTUM CARBON NANOTUBES

CROSS-REFERENCE TO RELATED APPLICATION(S)

This application claims priority to, and the benefit of, U.S. Provisional Application No. 62/807,548, filed Feb. 19, 2019, for all subject matter common to both applications. The disclosure of said provisional application is hereby incorporated by reference in its entirety.

GOVERNMENT SUPPORT

The invention is supported, in whole or in part, by the U.S. Government under Contract Number: FA8650-19-P-5192. The Government may have certain rights in the invention.

FIELD OF THE INVENTION

The present disclosure relates to systems and methods for producing a volume of carbon nanotubes. In particular, the present disclosure relates to the preselection of metallic conducting single wall armchair carbon nanotubes having specific chirality and large-scale production of the armchair carbon nanotube having the specific chirality. The armchair carbon nanotubes and other metallic nanotubes created by the present disclosure can be identified as quantum nanotubes. The present disclosure can also be used for the synthesis of carbon nanotubes and zig-zag CNT which can be used in the fabrication of wires, sheets forests, and other macroscale articles.

BACKGROUND

Generally, it is assumed that the specific molecular symmetry associated with CNT armchair tubes uniquely mitigates the effects of defects, bends, kinks, and overall disorder which have an important role in charge transport in carbon. These symmetries in CNTs are expected to lead to dispersionless ballistic conduction and ultimately large mean free paths for the charge carriers and therefore higher conductivity. Overall there are twice as many conductive channels so the conductivity can be higher than in conventional semiconductor nanotubes. Many other factors influence the conductivity of an assembly of CNTs. Among the more important are: (1) bundle or tube overlap, (2) CNT length, (3) alignment, (4) defects, (5) contaminants, (6) Schottky barriers, (7) doping, (8) tube packing density, (9) tube chirality distribution, and (10) nanotubes diameter.

Carbon nanotubes can grow as metallic conductors with a zero bandgap, or semiconductors of varying bandgaps. Typically, chemical vapor deposition (CVD) synthesis of single wall CNTs produces about ⅓ metallic conductors with the remainder being the lower conductivity semiconductors. It has not been possible to continuously grow all metallic conducting tubes using conventional systems and methods.

SUMMARY

There is a need for improvements for the synthesis process for metallic armchair nanotubes growth that can improve ballistic conduction leading to higher conductivity and for zigzag mostly semiconductor CNTs for semiconductor applications. The present disclosure is directed toward addressing this need, in addition to CNT products having other desirable characteristics. The systems and methods of the present disclosure can be used for producing high chiral angle metallic conducting single wall armchair carbon nanotube material of a substantially (12,12) chirality, which can be extended to the synthesis of (9,9), (10,10), (11,11), (12,12), and (13,13) etc. metallic armchair carbon nanotubes and as well as other chiralities. These high chiral angle metallic conductivity single wall armchair carbon nanotubes can be used to produce metallic wire, string, tape, sheets, and forests. In particular, the carbon nanotubes of the present disclosure can be used to produce wires containing substantially all metallic armchair tubes through a large scale chiral-selection synthesis process. In an embodiment, the present disclosure provides methods and systems to select and grow relatively large volumes of particular chiral metallic carbon nanotube for the fabrication of wire/yarn, braid, cable, sheet, tape, etc. Moreover, the preselected metallic armchair nanotubes can be used for electron emitters, when continuously formed into wire, these wires may also be knitted or woven into fabric and for various other electrical applications including potentially, in one embodiment, into semiconductor devices The systems and methods of the present disclosure includes a specific combination of steps including utilizing a carbon source that provides substantial numbers of ethylene and ethylene radicals, utilizing a high hydrogen to carbon ratio sufficient to "passivate" all other non-armchair growth sites to a higher degree than armchair growth sites, and to implement a process that can be tuned to create a well-controlled population of catalyst diameters with sparse modal distribution that falls within a range of the desired single wall diameters.

In accordance with example embodiments of the present disclosure, a method for synthesizing nanotubes of a preselected chirality is provided. The method includes introducing a carbon source into a reactor in the presence of a catalyst having a diameter corresponding to a diameter of the preselected chirality, allowing the carbon source to decompose to its atomic constituent to allow attachment of the atomic constituent to the catalyst for subsequent growth of carbon nanotubes, and injecting, into the reactor, a relatively high atomic ratio of hydrogen to carbon to passivate non-armchair growth sites on the carbon nanotubes, so that a volume of carbon nanotubes of the preselected chirality can be synthesized In accordance with aspects of the present disclosure, the carbon source has a high concentration in ethylene or ethylene groups. The providing the catalyst can have the diameter including tuning a growth process for the catalyst to yield a desired catalyst diameter. The high atomic ratio of hydrogen can be larger than 10/1. The volume of nanotubes of the preselected chirality is predominantly nanotubes of one of (9,9), (10,10), (11,11), (12,12), or (13,13) chiralities. The method can further include spinning, by a yoke spinner, the volume of nanotubes of the preselected chirality into a continuous wire of nanotubes of the preselected chirality over 100 m long. The method can further include growing the nanotubes at a temperature in the reactor between 1200° C. and 1350° C., preferably 1260° C. to 1290° C. The diameter of the preselected chirality ranges from 0.4 nanometers (nm) to 3 nm by tuning of growth parameters by stopping the catalyst from growing beyond the desired diameter by adding either oxygen, sulfur or carbon, or combinations of these, to the growing catalyst at a correct growth stage. The volume of nanotubes of the preselected chirality is a forest consisting of substantially all nanotubes of the preselected chirality. The method can further include pulling the volume of nanotubes of the preselected chirality into a tape or sheet. The carbon source can produce ethylene byproducts when heated and can be taken from a group containing at least one of acetylacetone, acetone, ethyl alcohol, toluene, ethane, ethylene gas, propanol, n-hexane, methane, benzene, methyl benzene, butane, benzyl alcohol, and natural gas.

In accordance with example embodiments of the present disclosure, a composition is provided. The composition includes a volume of metallic carbon nanotubes having about 50% to 95% or more by volume of armchair carbon nanotubes with a single preselected chirality with a substantially uniform diameter.

In accordance with aspects of the present disclosure, the single preselected chirality is from one of (9,9), (10,10), (11,11), (12,12) and (13,13). The diameter can range from about 0.4 nm to about 3.0 nm. The volume of metallic carbon nanotubes can be used to make a yarn. The yarn can be used to make one of a braid or wire. One of the braid or wire can be used to make a cable. An electromagnetic interference (EMI) shielding with a sheet material being a woven or non-woven matt created from the yarn can be fabricated from the volume of metallic carbon nanotubes. The volume of metallic carbon nanotubes can be used to make a tape. The tape can be used to make a wire. The tape can be used to make a cable or sheet. The volume of metallic carbon nanotubes can be used to make an array. The volume of metallic carbon nanotubes can be used to make a forest. The forest can be formed using a small catalyst, an excess of hydrogen and an excess of acetone groups. The forest can be spinnable as a yarn or can be pulled into a tape or a sheet. The volume of metallic carbon nanotubes can be used to make a carbon nanotube based ohmic heater with a lower voltage to be used than standard multiwall carbon nanotubes.

In accordance with example embodiments of the present disclosure, a method for synthesizing zigzag nanotubes of a preselected chirality is provided. The method includes introducing a carbon source into a reactor in the presence of a catalyst having a diameter corresponding to a diameter of the preselected chirality, allowing the carbon source to decompose to its atomic constituent to allow attachment of the atomic constituent to the catalyst for subsequent growth of the zigzag nanotubes, and injecting, into the reactor, a relatively low atomic ratio of hydrogen to carbon to passivate non-armchair growth sites on the zigzag nanotubes, so that a volume of the zigzag nanotubes of the preselected chirality can be synthesized.

In accordance with example embodiments of the present disclosure, the carbon source has a high concentration in propene or propene groups.

BRIEF DESCRIPTION OF THE FIGURES

These and other characteristics of the present disclosure will be more fully understood by reference to the following detailed description in conjunction with the attached drawings, in which:

FIG. 3B is a yoke spinner system suitable as one embodiment for making CNT armchair wire, in accordance with the present disclosure;

DETAILED DESCRIPTION

Figure 1:
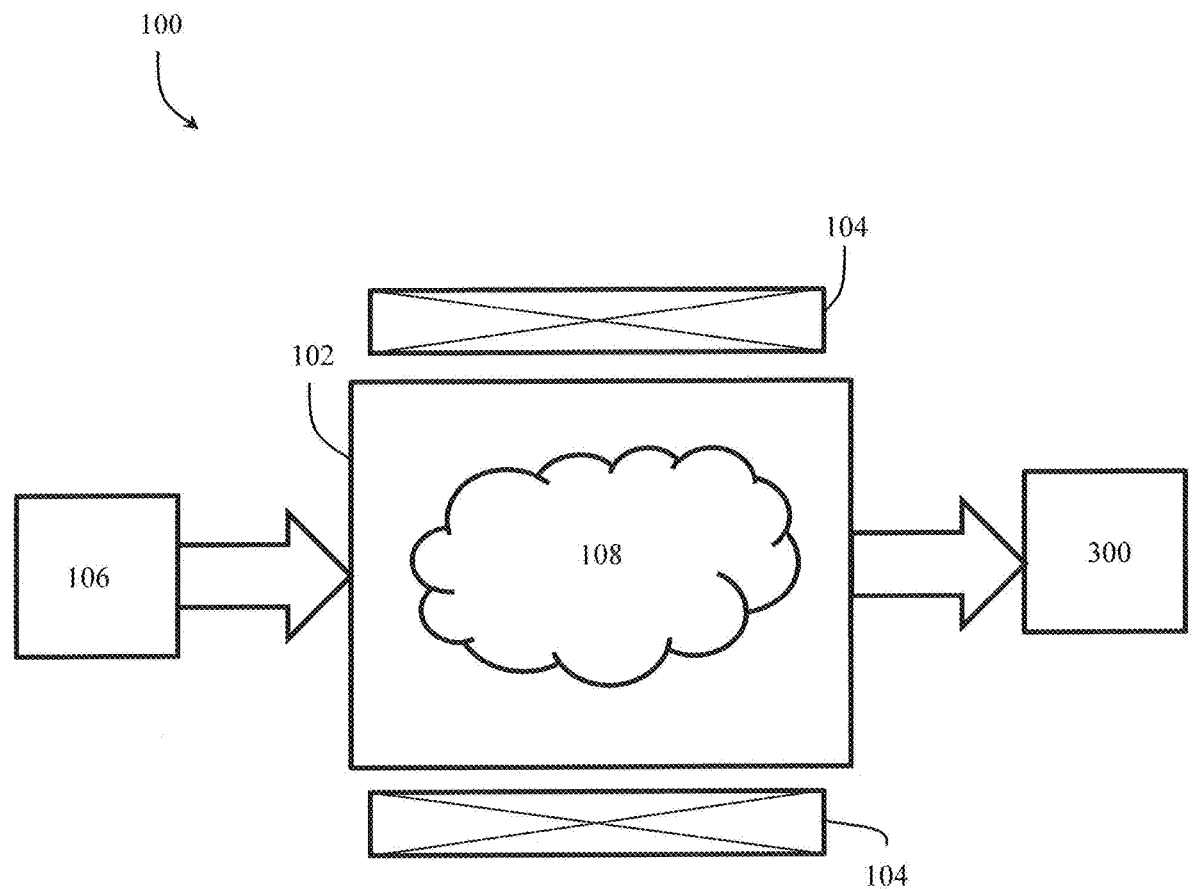
FIG. 1 is an example of a schematic diagram for a reactor for making armchair CNTs, in accordance with the present disclosure.

An illustrative embodiment of the present disclosure relates to systems and methods for producing armchair carbon nanotubes (CNTs). In particular, systems and methods capable of mass producing armchair single wall carbon nanotubes (SWCNT) of a particular chirality. The present disclosure can tune a chemical vapor deposition (CVD) process through a specific combination of steps and parameters to continuously produce improved volumes of SWCNTs that can be used for numerous applications not previously achieved through traditional CVD processes. For example, the processes of the present disclosure can be used to yield continuous growth SWCNTs and produce wire from different single wall armchair chiralities.

Growth of a volume of single wall carbon nanotubes of a desired chirality by chemical vapor deposition, in accordance with embodiments of the present disclosure, can involve three main processes. Those processes can include introducing various reactants into the reactor, including a thermally decomposable carbon source into a CVD reactor, introducing a catalyst or catalyst precursor into the CVD reactor, and introducing a chemical reactant into the CVD reactor to lower the surface energy which accelerates growth. Examples of carbon sources can include acetylacetone, acetone, ethyl alcohol, toluene, ethane, ethylene gas, propanol, n-hexane, methane, benzene, methyl benzene, benzyl alcohol, butane, natural gas and many others. Different carbon sources can be used to target different types of CNTs and/or different CNT chirality. In some embodiments, the present disclosure can utilize a carbon source that has a preponderance of ethylene and ethylene radicals. The carbon source can also be provided, for example, in the form of ethylene reactants to grow CNTs.

Regardless of the carbon source used, during the CVD process, the carbon sources should be introduced along with a hydrogen carrier gas. The carbon nanotubes in-turn interact electrostatically to form a three-dimensional aerogel-like structure which is termed a CNT sock. The role of acetylacetone is to provide a carbon source in the correct form, while the role of hydrogen is to adsorb on the sites of high coordination of the nanotube growth surfaces. Since the armchair sites are of low coordination, hydrogen acts to suppress all non-armchair chiralities. It can also suppress soot formation and can dissolve amorphous carbon. In some embodiments, the present disclosure utilizes a high atomic ratio (>10/1) of hydrogen to carbon to preferentially passivate all non-armchair growth sites.

In some embodiments, the selection of different catalyst precursors can be used to change the physical process of graphene lattice production. In some embodiments, the present disclosure can be used to a catalyst with a diameter in a neighborhood of the armchair diameter of interest. To achieve the appropriate catalyst diameter, the parameters of the growth process may need to be specifically tuned to yield the desired catalyst diameter. For example, a catalyst with a diameter closely related to the desired diameter of the SWCNT can to be introduced into the reactor or preferably grown within the reactor to grow CNTs of a similar diameter. In some embodiments, these catalysts can be magnetic transition elements or combinations of these with themselves or with oxides. Examples of metal organic catalyst precursors include ferrocene, cobaltocene, nickelocene, and/or combinations with other transition elements. Examples of catalysts can be iron, cobalt, nickel along with sulfur, carbon or metal oxide or metal chloride additions.

In some embodiments, the catalyst diameters can be determined by (1) the break down temperature for the catalyst compound used as well as the time this precursor spends within a temperature zone (for example, ferrocene breaks down under conditions in one of our furnaces at 500° C. at a gas flow rate of say 4 standard liters per minute in a 0.188" inside diameter drift tube), (2) the catalyst size will be reduced by adsorbed molecules for example carbon or/and by sulfur, and (3) the residence time in the narrow injection tube and by the evaporation rate which itself is a function of temperature. The break down temperature and time may vary based on the type of furnace being used during the process.

In some embodiments, the catalysts can be attached to oxides, or they can be created as separate particles outside of the reactor and then introduced with the carbon source. Examples of oxides are $Al_2O_3$, MgO, and the like. If a catalyst can be created by a decomposition, this usually proceeds in a stepwise manner, with the first step being the creation of the catalyst atom, then very rapid growth by progressive collisions with other carbon atoms or carbon clusters to form the desired catalyst cluster size. In some embodiments, size can be governed by temperature and time and the absorption of a foreign reactant designed to stop the catalyst growth at a given point. Examples of foreign reactants are carbon, oxygen or sulfur. This process usually results in a wide distribution of catalyst diameters, which can be dependent on the thermal history of the catalysts, concentration of the precursor and other gases, which may keep the catalyst surface clean, and how quickly they stop the growth. In accordance with an example embodiment or the present disclosure, the catalyst growth process can be carefully controlled to stop the growth at a narrow enough size distribution to produce the desired chirality.

The CVD process, in an embodiment of the present disclosure, can also include the introduction of a chemical reactant to lower the surface energy of the catalyst, to accelerate growth of the carbon nanotube from the catalyst. Examples of elements that can lower surface energy include carbon, oxygen or sulfur. Sulfur can be derived from almost any sulfur compound (thiophene, sulfur vapor, $CS_2$ or the like). The nature of the sulfur (or even oxygen or, water, which can be a source of oxygen) can affect the size of a catalyst due to the temperature at which it decomposes and gets adsorbed onto the catalyst during the growth process. For example, in the case of $CS_2$, the carbon can react with the catalyst and $CS_2$ can decompose to provide sulfur at a lower temperature in comparison to thiophene. Thiophene, in some embodiments, may also be used to provide sulfur to stop catalyst growth, but because its decomposition temperature can be higher than that of $CS_2$, it may allow the catalyst to grow to larger sizes and therefore offers one means of controlling catalyst size, the other one being temperature. Carbon, which can affect catalyst size, can also be sourced from organic fuels.

Providing the above-noted combination of steps within a CVD process can yield CNT growth to produce a volume of carbon nanotubes of a particular armchair chirality, not previously realized in traditional CVD processes.

FIGS. 1 through 6B, wherein like parts are designated by like reference numerals throughout, illustrate an example embodiment or embodiments of improved systems and methods for producing armchair carbon nanotubes (CNTs), according to the present disclosure. Although the present disclosure will be described with reference to the example embodiment or embodiments illustrated in the figures, it should be understood that many alternative forms can embody the present disclosure. One of skill in the art will additionally appreciate different ways to alter the parameters of the embodiment(s) disclosed, such as the size, shape, or type of elements or materials, in a manner still in keeping with the spirit and scope of the present disclosure.

Referring to FIG. 1, an example embodiment of a reactor 100 used for growth of carbon nanotubes in accordance with the present disclosure is depicted. Any combination of reactors known in the art can be used, and the reactor and process 200 combined with the reactor 100 are provided herein for example purposes only. In some embodiments, the reactor 100 can be designed for a gas phase pyrolysis process and can include a furnace 102, a heater 104, and an injector 106. The furnace 102 can utilize a mullite tube, other ceramic, or metallic tube (Ni—Cr—Al alloy) and can include an external tube diameter sized for producing CNTs. For example, the furnace 102 can be dimensioned with a diameter of about 3 inches to 10 inches, preferably about 3 inches and from 1 to 4 feet long, preferably 36 inches long. In some embodiments, the heater 104 can be positioned circumferentially about the furnace 102 and configured to heat the interior of the furnace 102 to temperatures ranging from 1200° C. to 1350° C., preferably about 1290° C. The heater 104 can include a collection of heaters designed to heat the furnace 102 and/or the injector 106. In some embodiments, the injector 106 can contain its own heaters that work in conjunction with the main furnace 102 heater 104 to create a desired temperature gradient.

In some embodiments, the reactor 100 can have different heating zones calibrated for the decomposition of the reactants, growth of the CNTs, and the slowing down and/or stoppage of growth of the CNTs. In some embodiments, the growth zone of the CNTs can be optimized with a temperature range for CNT growth, but typically lower defect CNTs should be at temperatures ranging from 1200° C. to 1350° C., preferably about 1290° C. A combination of the furnace 102 and/or the injector 106, can include multiple heating zones and/or heating phases for adjusting the heat to a target range during the CVD process for the reactor 100.

In some embodiments, the injector 106 can include between 2 and 4 heating zones, each of which can have a temperature adjusted relative to its neighbor and calibrated for a particular effect during the CVD process. For example, a first zone (~200° C.) can be calibrated to assist in evaporation and decomposition of the carbon source and a second zone (~500° C.) can be calibrated to assist the iron catalyst source breaking down into carbon atoms where they may immediately cluster to form a catalyst, and a third zone (~850° C.) can be calibrated to assist the clustering to stop or slow down. In some embodiments, the third zone can be calibrated for the decomposition of a sulfur source which absorbs with existing carbon onto a surface of a catalyst to help stop catalyst at the desired size, and help reduce the surface energy of the iron catalyst. In some embodiments, the injector 106 can be configured to monitor and regulate desired temperatures in each of the zones. In some embodiments, temperature gradients can also be established in the main furnace 102 and/or the injector 106 can be set up with one or two surrounding heaters. In some embodiments, additional individual heaters can be added and controlled through thermocouples placed along an injection tube of the injector 106. In some embodiments, the injector 106 does not have multiple heating zones, but the furnace 102 can have multiple heating zones calibrated for the decomposition of the reactants, growth of the CNTs, and the slowing down and/or stoppage of growth of the CNTs.

The injector 106, as depicted in FIG. 1, can be configured to inject the various reactants for growing nanotubes within the furnace 102. In some embodiments, the injector 106 can be configured to inject a carbon source, a "promotor" (e.g., sulfur or oxygen), and a metallic transition metal catalyst at different points in the CVD process. The injector 106 can include a single mechanism for injecting the carbon source, the promotor, and the catalyst or it can include a plurality of mechanisms to inject each of the different reactants separately. The injector 106 can be designed to inject the different reactants simultaneously or at different predetermined stages of the CVD process. In some embodiments, a liquid carbon source can dissolve the catalyst and the promotor and then this liquid can be injected into the injector 106. As would be appreciated by those skilled in the art, any combination of vapor/liquid/gas/powder materials may be used for any of these key reactants. In some instances, the injector 106 can include flow controllers (not depicted) for metering a flow of reactants into the furnace 102. In some embodiments, the process of presetting the temperatures at different temperature zones can be based on the catalyst evaporation which takes place at much lower than bulk melting and evaporation temperature due to the nanoscale nature of the catalyst.

In some embodiments, the injector 106 can include a gradient heater or the heater 102 can heat the reactants before injecting them into the furnace 102. For example, a Watlow® gas heater can be used to provide the various temperatures of the process discussed herein. In some embodiments, the injector 106 can be designed to modify and/or apply conditions to certain reactants prior to injecting them into the furnace 102. For example, the injector 106 can heat, pulverize, cool, evaporate, vaporize, sublimate, etc. one or more of the reactants prior to injection.

In some embodiments, a carrier gas can be introduced to the furnace 102 (e.g., via the injector 106) to assist in carrying the reactants down the furnace 102. For example, carrier gases can include hydrogen or other inert gases such as helium (He) or argon (Ar). The furnace 102 can also include any combination of methods for outputting and/or drawings out the CNTs of the CVD process. For example, a combination of elements for attracting the carbon nanotubes to a spinning system (e.g., yoke spinner systems 300, 350) and enabling the CNTs to be manipulated to form various structures (e.g., wire, yarn, tape, etc.) can be used. For example, the CNTs can be output from the furnace 102 and directed into to a yoke spinner systems 300, 350 to form a yarn, and then wound about a bobbin within the yoke spinner systems 300, 350. The yoke spinner systems 300, 350 are discussed in greater detail below with respect to FIGS. 3A and 3B.

Figure 2:
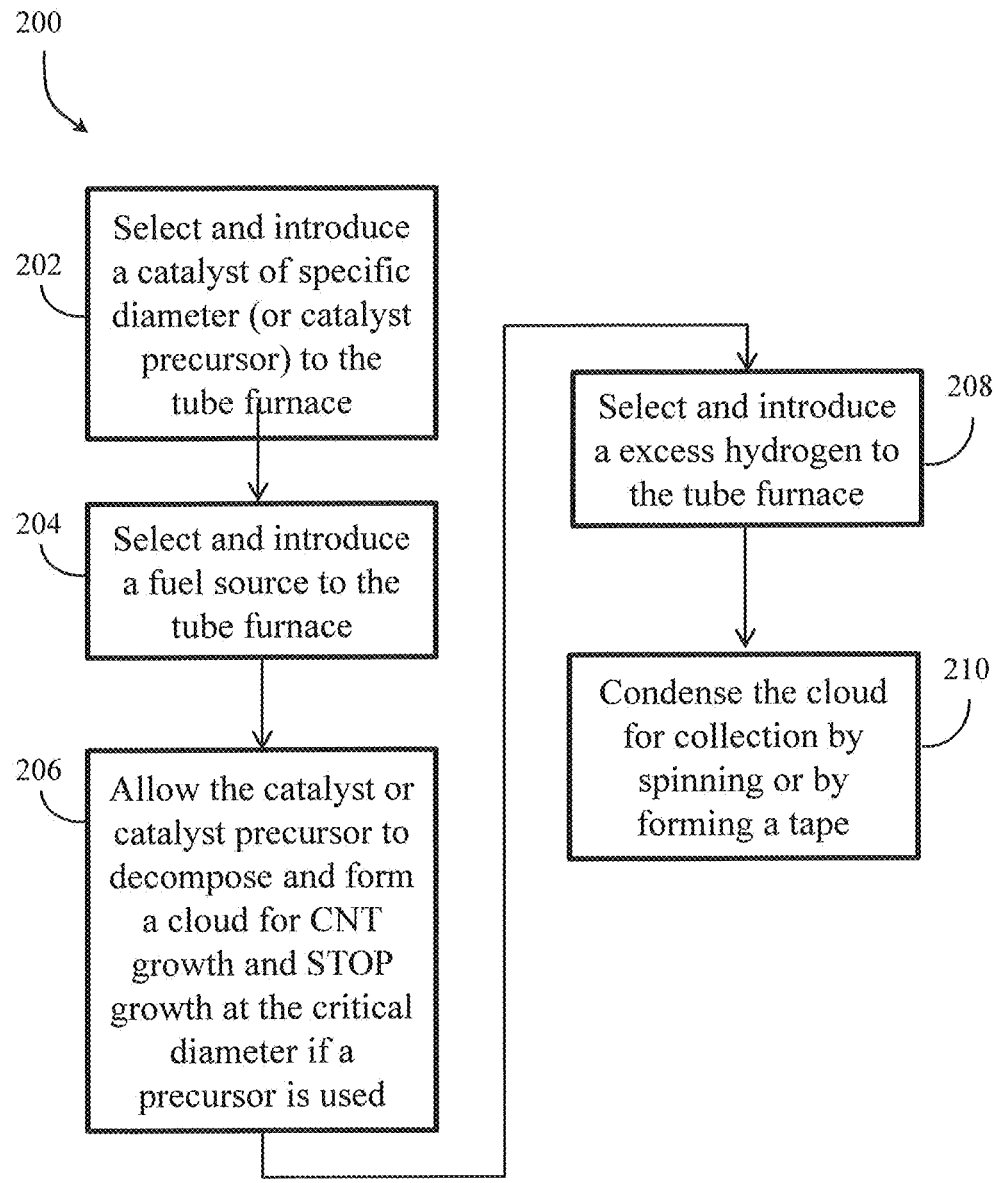
FIG. 2 is an example process for making continuous armchair CNTs, in accordance with the present disclosure.

Referring to FIG. 2, an example embodiment of a CVD process 200 for creating armchair carbon nanotubes (CNTs) in accordance with the present disclosure is depicted. The process 200 can implement a combination of steps to ensure that the following conditions are satisfied together in a gas mixture for use by the system 100. The gas mixture can be designed to produce (1) a significant amount of ethylene radicals as a carbon source, (2) a sufficient hydrogen to carbon ratio, likely larger than 10/1 atomic ratio of hydrogen to carbon to passivate all non-armchair like bonding sites, and (3) a large population of iron catalysts whose diameter is tuned within the mean diameter of the desired nanotube chirality.

At step 202 a catalyst precursor can be selected and introduced within the furnace 102 of the reactor 100, as depicted in FIG. 1, for example, by the injector 106. The catalyst can be provided to initially absorb carbon atoms and template the growth of the carbon nanotubes when the carbon source is introduced into the furnace 102. A catalyst can include any substance that is suitable for templating the growth of carbon nanotubes, including iron, cobalt, or nickel and combinations with various oxides known in the art. In some embodiments, the preferred metallic catalyst precursor can be progressively heated in the injector 106 as it is carried by hydrogen into the reactor 100. In some embodiments, the catalyst can be selected and heated within the furnace 102 to decompose from a precursor to be within the diameter size range of the armchair CNT that is being created. In some embodiments, the temperature range at this heating zone within the furnace 102 where the catalyst is being decomposed, can range from 100° C. to 850° C. In some embodiments, a narrow distribution of catalyst diameters can be achieved using catalyst precursors and controlling the thermal environment in such a way as to cause the catalyst to decompose and release iron at a position in space where it is exposed simultaneously to a carbon containing reactant and a sulfur reactant, which together deposit carbon atoms and sulfur on the catalyst surface and arrest its growth.

In some embodiments, the catalyst can be stopped from growing beyond the desired diameter by adding either oxygen, sulfur, carbon, or combinations thereof to stall the growing catalyst at a desired growth stage (e.g., at a desired diameter). Ideally, the target size distribution should be narrow (i.e. with small standard deviation) and unimodal or sparse modal with a mode at the diameter of interest. For example, the diameter can be within ±0.2 nanometers (nm) (preferably ±0.1 nm) of a desired diameter of the armchair CNT. As an example, the diameter for the following CNTs (10,10), (11,11), (12,12) and (13,13) are respectively 1.38 nm, 1.51 nm, 1.65 nm, and 1.79 nm. Therefore, the center of catalyst size distribution to grow, for example the (12,12) CNTs should be about 1.65±0.2 (preferably ±0.1 nm) with the main mode of the distribution at 1.65 nm. As would be appreciated by those skilled in the art, it should be possible to create catalyst diameter sufficiently within the diameter ranges to grow a preponderance of the desired armchair tubes.

At step 204, a fuel source or carbon source can be selected and introduced into the reactor 100, for example from the injector 106 into the furnace 102. In some embodiments, a carbon source containing mostly ethylene and ethylene groups or radicals can be selected for introduction into the reactor 100. The function of the carbon source is to provide carbon in the form of ethylene reactants and other carbon reactants which may be useful in attaching to the armchair sites on the desired nanotube. Other carbon sources can also produce ethylene products when heated and can be taken from a group containing acetylacetonate, acetone, ethanol, methyl alcohol, ethylene gas, toluene, preferably acetylacetonate. In some embodiments, the carbon source can be condensed in a liquid, such as acetone to create CNTs with relatively higher density by establishing more tube to tube contacts. In some embodiments, acetylacetonate ($C_5H_7O_2$), can be selected as a carbon source because it has a high yield of ethylene groups. Acetylacetonate as a carbon source is rarely, if at all, used for CNT growth, although its breakdown products can be found in other fuel combinations. Using acetylacetonate, in accordance with the present disclosure, can provide thermal breakdown products that contain double bonded carbons which then can provide a better fit onto growth sites.

In some embodiments, the inclusion of breakdown products, such as methane, can be used to heal growth defects. For example, a small amount of methanol may be added to a liquid carbon source. In some embodiments, a combination of high temperature growth, annealing within a temperature gradient, heating in an organic gas can heal surface defects.

In some embodiments, the carbon source can be vaporized (i.e., turned into a gas) within the injector 106 for example at 200° C. As another embodiment the carbon source may be ethylene gas. Growth of CNTs at the end of the injector 106 can be initiated and continues into the furnace 102. The growth temperature within this heating zone can be optimized for CNT growth, but typically lower defect CNTs should be at temperatures ranging from 1200° C. to 1350° C., preferably about 1290° C. The nano-sized catalysts can evaporate in milliseconds or less at 1000° C. so such reaction can be very fast. These healing methods can be combined with other methods, such as optimizing hydrogen and oxygen content and annealing the yarn at low current densities to reduce defects. As the carbon source decomposes to its constituent carbon radicals and growth of the CNTs is initiated by the carbon atoms onto the catalysts, a CNT sock 108 may be formed within furnace 102. As would be appreciated by one skilled in the art, other fuel types can be utilized in accordance with the present disclosure. For example, ethanol, acetone, hexane, or toluene can be used in addition to or in place of acetylacetonate without departing from the scope of the present disclosure. Vapor forms of these reactants also can be used, or even natural gas can be used if reformed into ethylene reactant.

In some embodiments, the inclusion of breakdown products, such as methane, can be used to heal growth defects. For example, a small amount of methanol may be added to a liquid carbon source. In some embodiments, a combination of high temperature growth, annealing within a temperature gradient, and heating in an organic gas can heal surface defects on the CNTs. The growth temperature can be optimized to effectuate healing of any defects on the CNTs, but generally, such a temperature range can be about 1200° C. to 1290° C. The healing process, in an embodiment, can be combined with other methods, such as optimizing hydrogen and oxygen content and annealing the CNTs at relatively low current densities to reduce defects.

In some embodiments, step 204 can include injecting a separate sulfur compound, such as sulfur vapor, carbon disulfide, thiophene, or other compound containing sulfur. The injection of the sulfur compound can lower the surface energy of the catalyst, and also serves to stop the catalyst from growing. In some embodiments, the growth of the catalyst can be controlled by the sulfur compound being injected in the reactor 100 substantially near where the catalyst is growing. Alternatively, a means of injecting oxygen in the form of furan, or water or gaseous oxygen can be used. In some embodiments, the catalyst can be pre-formed outside of the reactor 100 to the correct size then introduced with the carbon source. Although provided here as separate steps, steps 202, 204, and 208 can be implemented (i.e., injection of reactants) at substantially the same time.

To the extent that it is desirable, during step 206, the catalyst precursor can continue to thermally decompose to form its metallic atom, along with the carbon source. For example, a ferrocene precursor can rapidly form iron atoms to make the catalyst precursor in time frames of milliseconds or less. For example, for ferrocene precursors, iron atoms grow by collision with each other to form clusters which themselves can grow by collision with each other, until growth is impeded by the usual absorption of carbon, sulfur, or oxygen or all three. At this point all the catalyst clusters can be substantially the same size. In some embodiments, there processes may end before the catalyst leaves the injector 106 and enters the furnace 102. For example, CNT growth can start within the injector 106 and continue in the furnace 102. Catalyst evaporation can also start at this point and can be very fast at even 1000° C.

At step 208 a large excess of hydrogen can be introduced into the reactor 100 to select (i.e., limit) CNT development of the CNTs to a desired type (e.g., armchair CNTs). For example, an amount of hydrogen can be selected to provide a sufficient ratio to the carbon source to substantially passivate all available bonding surfaces, except of the bonding sites for the armchair chiralities. The molar ratio of excess hydrogen to carbon can vary from 10/1 to 50/1. Similarly, the low end of this molar ratio is 10/1 and the high end is likely about 50/1 molar ratio (moles of hydrogen to moles of ethanol), with a preferable ratio of about 30/1 for single wall armchair carbon nanotubes.

In some embodiments, a large amount of hydrogen, relative to a carbon source, can selectively create an armchair chirality through selective passivation by causing suppression or poisoning of all the non-armchair growth sites. The ratio of hydrogen to carbon can affect how carbon will form, for example, at too low a ratio, carbon will form soot in the gas phase and at too high a ratio, the CNTs will dissolve. For example, hydrogen bonds to the zigzag tubes and other non-armchair chiralities more strongly that it bonds to the growth sites of armchair growth sites, therefore, hydrogen can poison growth of non-armchair chiralities more than armchair chiralities by making it more difficult for new carbon radicals to attach to the growth sites for zigzag tubes (not armchair or necessarily metallic) and other non-armchair chiralities. Thus, when injecting a high ration of hydrogen, an increased chance of armchair chiralities can be created.

In some embodiments, to achieve a desirable level of passivation for armchair chiralities, a ratio of hydrogen to carbon source of 10:1 to 20:1 can be utilized. This passivation by hydrogen coupled with the correct catalyst size together with the particular fuels will preselect these armchair growth chiralities and suppresses others to a very large extent. In accordance with an embodiment of the present disclosure, the volume or sock of CNT generated by the method of the present disclosure can be about 50% to 95% or more by volume armchair carbon nanotubes of a single chirality, for instance (12,12). In some embodiments, the heat ranges can be changed to move the catalyst from one chirality to another.

Although the process of the present disclosure is discussed herein with respect to armchair CNTs, the process can be adapted to preferentially grow zigzag nanotubes or other CNT structures. For example, a volume of zigzag nanotubes can be grown by eliminating all the ethylene groups and substituting propene groups which will tend to enhance growth for non-armchair geometries (such as zigzag or other chiral configurations), reducing the hydrogen content (e.g., using less than 10/1 atomic ration of hydrogen to carbon ratio), and deliberately selecting catalyst diameter to be close to the desired tube. As would be appreciated by one skilled in the art, different levels of hydrogen or other combinations of gases can be used to specifically target growth of specific CNTs (e.g., non-armchair chiralities) without departing from the scope of the present disclosure. This alternative process may be very useful in growing semiconductor tubes.

At step 210 the gaseous sock 108 of armchair CNT, and byproducts of the reactions, can be evacuated from the furnace 102 or directed out of the furnace 102. The results of process 200 can produce metallic armchair carbon nanotubes whose diameters can be varied from about 0.4 nm to about 3.0 nm by careful tuning of the growth parameter which can be used to fabricate an armchair based CNT yarn of predominantly a single diameter chosen deliberately from about 0.4 nm to about 3.3 nm as any of the standard armchair chiralities. By tuning the diameters, band gap control can be avoided. Band gap (eV) scales at about 0.7/d (d in nm) and larger CNTs at about 10 nm can become sterically unstable and collapse into ribbons. By making all metallic tubes, the band gaps can all be about 0 eV.

Figure 3A:
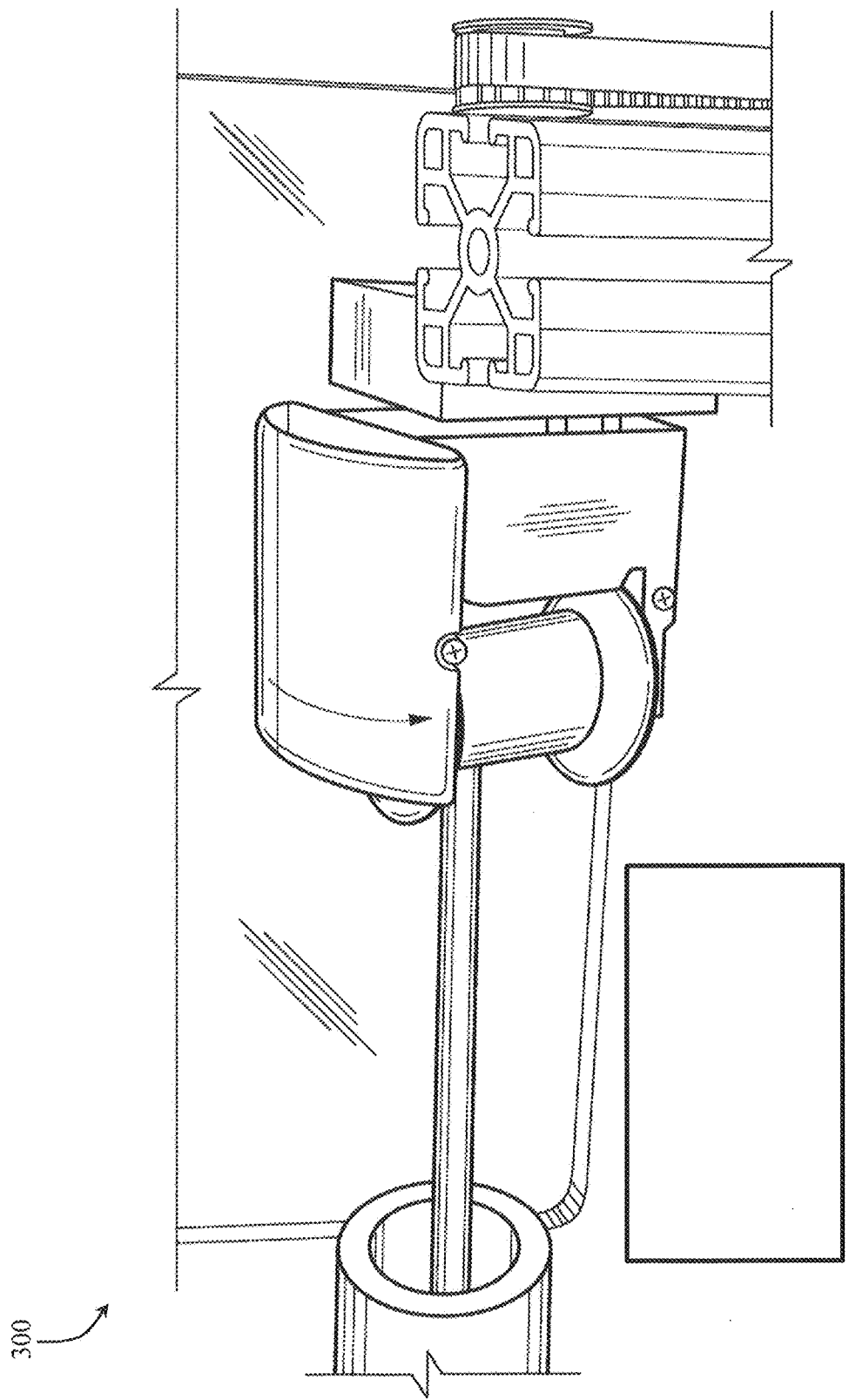
FIG. 3A is a yoke spinner suitable as one embodiment for making CNT armchair wire, in accordance with the present disclosure.

In an embodiment, the CVD process can further include in situ spinning, for example, by a yoke spinner, of continuous yarn of nanotubes of the preselected chirality (e.g., significantly over 100 m long). Referring to FIGS. 3A and 3B, in some embodiments, the aggregates (i.e., gaseous sock) of armchair CNT can be directed from the furnace 102 onto yoke spinner system 300, 350 or other system, and subsequently spun into wire or yarn and further manipulated to form specific structures using any combination of methods known in the art. In some embodiments, the gas flows during growth of the CNTs can be controlled to target a desired bundle alignment. For example, FEA modelling of gas flows can be used to eliminate eddy currents, keep reactants concentrated until reaction is complete. Additionally, yarns can be spun (e.g., by the yoke spinner system 300) with approximately 10-15-degree pitch angle while tensioning the yarn to align the bundles. This combination of steps can significantly stretch the length of the yarns and improve alignment.

In some embodiments, the yoke spinner system 300, 350, as shown in FIGS. 3A and 3B, can be utilized to transform the sock 108 (or aggregated CNT), produced within and directed outside the reactor 100 to be subsequently spun from the reactor 100 into a CNT armchair yarn. Referring to FIG. 3A, a yoke spinner system 300 suitable for spinning of the nanotube sock 108 into a yarn as it exits the reactor 100 is depicted. In some embodiments, the sock 108 can exit the furnace 102 and/or can be directed out of the furnace 102 where the sock 108 can be spun by the yoke spinner system 300 into a yarn. The yoke spinner system 300, or other mechanism, can be designed to introduce the spun yarn onto a bobbin 360, which can be designed to rotate at a preselected speed or a programmed speed, while the yoke spins it at high RPM, around the axis of bobbin rotation to create a continuous wire. For example, the yoke spinner system 300 can be used to transform a sock 108 of quantum armchair CNTs into a yarn that can be over 100 m long.

In some embodiments, the motions of the yoke spinner system 300 can be controlled by digitally controlled servomotors. For example, the yoke spinner system 300 can be made of aluminum and include a bobbin that can be designed to rotate independently of the yoke in which it is mounted, with both rotations being controlled by a servo motor(s). Although, servo motors are discussed, any combination of motors can be used, for example, stepping motors. The function of the yoke spinner system 300 is to spin a yarn and wind it up on a bobbin for subsequent processing. In some embodiments, the yoke spinner system 300 can provide a desired twist of about 10 to 30 degrees, preferentially about 15 degrees. Achieving such a degree of twist can require the yoke to spin at or over 2000 RPM.

Referring to FIG. 3B, an example yoke spinner system 350 is depicted. In some embodiments, the yoke spinner system 350 can include one or more tensioners 352, a tension measuring and adjustment device 354, a distributer 356, a yoke 258, and bobbin 360. In operation, the sock 108 can be received from the reactor 100, using any combination of known methods or systems, and can be condensed down into a yarn using any combination of methods known in the art. In particular, the sock 108 can be provided for entry into the one or more tensioners 352, which can pull the sock over a combination of rollers, which can be twisted to reset tension on the draw yarn. Thereafter, the yarn can be provided to the tension measuring and adjustment device 354 which can automatically adjust a tension on the yarn based on the measured amount of tension, for example, by moving in a vertical to adjust a level of tension. The tension measuring and adjustment device 354 can provide the yarn to the distributer which can adjust the yarn for uniform entry onto the yoke 258. In some embodiments, the yoke 258 can have a winding up motion that is adjustable based on a feedback loop received from tension measuring and adjustment device 354 to adjust the axis of the yard at a desirable angle, for example, 15 degrees. In some embodiments, the bobbin 360 can receive the yarn from the yoke 258 and can spin at a high level of RPM to hold a large amount of yarn (e.g., over 200 KM of yarn) on a single spool. In addition, the bobbin 360 can be provided with a translating motion to permit uniform placement of the yard onto and across the bobbin 360. The bobbin 360 can be removed and replaced with a fresh bobbin once it has reached capacity. The system 350 can be used to provide a cleanly wrapped yarn around a removeable and replaceable bobbin 360 which can be used to create other materials and/or devices, as discussed herein.

Using the steps in process 200, the combination of the reactor 100 and the yoke spinner system 300, system 350, or other system can produce a CNT yarn in situ in the reactor 100 with no post processing and no outgassing additives. Once a volume of CNTs is created within the reactor 100, any combination of post processing steps can be utilized to yield a combination of materials containing all metallic armchair nanotubes and for CNTs of a preselected chirality. For example, any combination of a yarn, tape, wire, cable, array, sheet, forest, etc. can be formed from CNTs of about 50% to 95% or more by volume armchair carbon nanotubes of a single chirality and having a substantially uniform diameter.

Similarly, the combination of materials can be further used to fabricate other materials formed from CNTs of about 50% to 95% or more by volume armchair carbon nanotubes of a single chirality and having a substantially uniform diameter. For example, a yarn from the process 200 can be condensed or braided into a wire, or can be used to form other macroscale articles, such as tape, cable, sheets etc. The reactants used in the CVD process can also be selected to create particular structures from the CNTs. For example, a forest can be formed using a small catalyst, an excess of hydrogen and an excess of acetone groups. The forest can be spinnable as a yarn or can be pulled into a tape or a sheet.

More complex structures can also be created using the volume of CNTs of the present disclosure. For example, a CNT based ohmic heater, enabling a lower voltage to be used than standard multiwall CNTs, can be created or an electromagnetic interference (EMI) shielding can be created with the sheet material being a woven or non-woven matt created from yarn. The materials and devices discussed herein, among others, can be produced using a volume CNTs of about 50% to 95% or more by volume armchair carbon nanotubes of a single chirality and having a substantially uniform diameter using any combination of manufacturing methods known in the art.

In some embodiments, the yarn, tape, wire, cable, array, sheet, forest, etc. can be cleaned of any potential surface contamination. For example, the wire, yarn, tapes, bundles, etc. can be cleaned in organic, electrochemically conducting cleaning as a cathode in a non-reacting solvent, cleaned cathodically to evolve hydrogen on the surface and reduce any oxides, and/or cleaned anodically to oxidize the surface and destroy most organics. In some embodiments, any combination of post processing steps can be performed on the resulting yarn, tape, wire, cable, array, sheet, forest, etc. to further enhance the effectiveness of the CNTs.

The present disclosure, as discussed with respect to FIGS. 1-3B, demonstrates systems and methods capable of mass production of carbon nanotubes of a single chirality and having a substantially uniform diameter. In operation, the present disclosure includes systems and methods to fabricate, by gas phase pyrolysis, substantially all armchair tubes of a preselected chirality (e.g., selected based on catalyst diameter) and carbon nanotube wire (or yarn) consisting of substantially all metallic conducting armchair tubes. In accordance with one embodiment, the wire utilizes over 50% to 95% by volume armchair carbon nanotubes of a single chirality and having a substantially uniform diameter. In short, the systems and methods of the present disclosure can use a carbon source that provides ethylene groups or radicals in combination with small amount of methane, in combination with an excess of hydrogen (10/1 or more atomic ratio with respect to carbon) and further in combination with a well-controlled CVD system to produce catalyst with a tight diameter distribution within at least 0.2 nm of the desired armchair tube. Using this combination of steps, a volume of carbon nanotubes can be grown with predominantly armchair tubes of the preselected chirality. The present disclosure provides the capability to mass produce armchair CNTs and can also be used to tune chirality of armchair CNTs, to include mass production of predominantly (9,9), (10,10), (11,11), (12,12), or (13,13), armchair nanotubes, thus enabling chirality preselection.

The resulting volume of carbon nanotubes created by the steps of the present disclosure can then be aggregated and formed into a combination of highly conductive materials. For example, using the yoke spinner system 300 of FIG. 3A, the systems and methods of the present disclosure can be used to spin armchair yarn from a sock 108 of carbon nanotubes produced in the reactor 100 from process steps 200. Using these processes, the CNTs can be modified to create, including but not limited to, a combination of wires/yarns, braids, string, cables, sheets, array, tape, etc. of predominantly (9,9), (10,10), (11,11), (12,12), or (13,13) chirality. As would be appreciated by one skilled in the art, any combination of mechanisms known in the art can be used to transform the yarn into other constructs. For example, the specifically designed yoke spinner system 300 or other mechanism can be used to spin armchair CNTs created by the present systems and methods of the present disclosure into yarn.

In some embodiments, forests of single wall carbon nanotubes of all armchair chiralities can be grown using these same concepts by adjusting the process 200 to produce controlled catalyst sizes of the appropriate (i.e. smaller or larger) diameter. In particular, a forest consisting of all armchair CNTs can be formed using a small diameter catalyst, an excess of hydrogen and an excess of acetone groups. In some embodiments, the catalyst can be formed from block copolymers or by other methods known in the art to form small catalyst diameters. The addition of an excess of hydrogen and provision of ethylene radicals can satisfy the criteria of the present disclosure, for the fabrication of all armchair tubes provided the block copolymer is capable of making catalysts in the diameters that are in the correct range to template armchair CNTs. As a result, a forest array of carbon nanotubes that are predominantly armchair can also be spinnable as a yarn (e.g., by yoke spinner system 300) or can be pulled into a tape or a sheet.

The various materials produced by the systems and methods of the present disclosure can be extremely electrically conductive on the nanotubes scale and, all things being equal, can have superior conductivity on the wire or yarn scale. In particular, nanotube wire made from armchair CNTs, with sufficient nanotube length, purity, and microstructural alignment, has the potential to match or exceed copper wire on a large enough scale to be commercially viable. For example, quality CNT emitters can be very high in armchair tubes content. Even within the armchair subset, there are a range of physical properties that can be targeted, although data on individual macro-assemblies of a specific chirality is sparse. For example, the (10,10) armchair SWCNTs produced in accordance with the present disclosure can exhibit a thermal conductivity ~40,000 W/m·K at ~100° C. and about 6,600 W/m·K at ambient temperature, mostly due to phonon characteristics. This is two times higher than graphene and about six times beyond other CNTs and three times higher than diamond at ambient temperature. It has been suggested that the conductivity of CNT wires, due to packing factors, becomes much better as the diameter of the armchairs decreases. The enthalpy of formation also increases as the diameter of the armchairs decreases so it is likely that an optimal tube diameter has yet to be determined. An example of an armchair diameter is d=1.65 nm for (12,12) nanotubes and diameters greater than d=0.55 nm for (4,4) nanotubes are most likely accessible. Diameters less than (4,4) are not experimentally observed, most probably due to their very high enthalpy of formation. However, the present disclosure suggests the potential to selectively create distinct armchairs from 0.55 nm (4,4) to perhaps 3 nm (22,22). For diameters much above 3 nm, single wall nanotubes are likely sterically unstable. Robust electrical conductivity, thermal conductivity and maximum current carrying capacity are parameters necessary for continual, efficient operation of high-power devices.

Applications for the yarn produced from the continuous CNTs of the present disclosure can include construction of all carbon nanotube coaxial cables with the center core being a quantum wire. For example, core copper wire can be replaced with an entirely armchair CNT wire for significantly higher conductivity. Similarly, an all CNT cable can be created with a CNT tape made from all armchair CNT wires. The CNTs can also be used for thermal management where the extraordinary thermal conductivity of (10,10) tubes (3× diamond at ambient temperature) can be used to cool integrated circuits directly or indirectly. An electromagnetic interference (EMI) shielding can be created with a sheet material made from the CNTs, for example, from a woven or non-woven matt of all armchairs CNTs. A CNT based ohmic heater can be created where the armchair CNTs enable a lower voltage to be used than standard multiwall CNTs. The high conductivity of this material also is enabling for electron emitters, large power cables and for very high conductivity electric brushes for carrying current to motors of all kinds. An example is a brush for carrying current for a rail gun. Another application can include armature winding in heavy traction motors or for high voltage power lines. The use of CNTs is not limited to these examples and the examples are merely provided to show the benefit of CNT materials using a volume of carbon nanotubes of a single chirality and having a substantially uniform diameter.

As discussed herein, in some embodiments, the systems and methods of the present disclosure can be utilized to create single wall carbon nanotubes (SWCNTs) at a target diameter. To create SWCNT, the catalyst growth must be stopped when it is less than 3 nm in diameter. The carbon source material can absorb into or onto the catalyst and then diffuse to form a cap (half a Bucky Sphere) on the catalyst or through the catalyst. The stronger bonding of high ratio hydrogen to non-armchair configurations will hinder growth more than the bonding of hydrogen to an armchair configured cap. The armchair sites will therefore be favored especially as ethylene will attach and complete the benzene ring. Once growth has initiated it may not be necessary for catalyst to be in position, as the most likely Diels-Alder type of direct attach reaction can now continue with or without the catalyst present. The catalyst lifetime at the high growth temperatures is short, so the nanotubes of all the same size will be preferred and growth can occur rapidly even in the absence of a catalyst. The product of this process is substantially pure single wall tubes of the same exact chirality. The purity can range from 50% to 100%, preferably over 90% by weight. This purity can be discerned by the height of the radial breathing mode (RBM) above the G peak, and the relatively small other RBMs that might be present in the Raman spectra.

Figure 4:
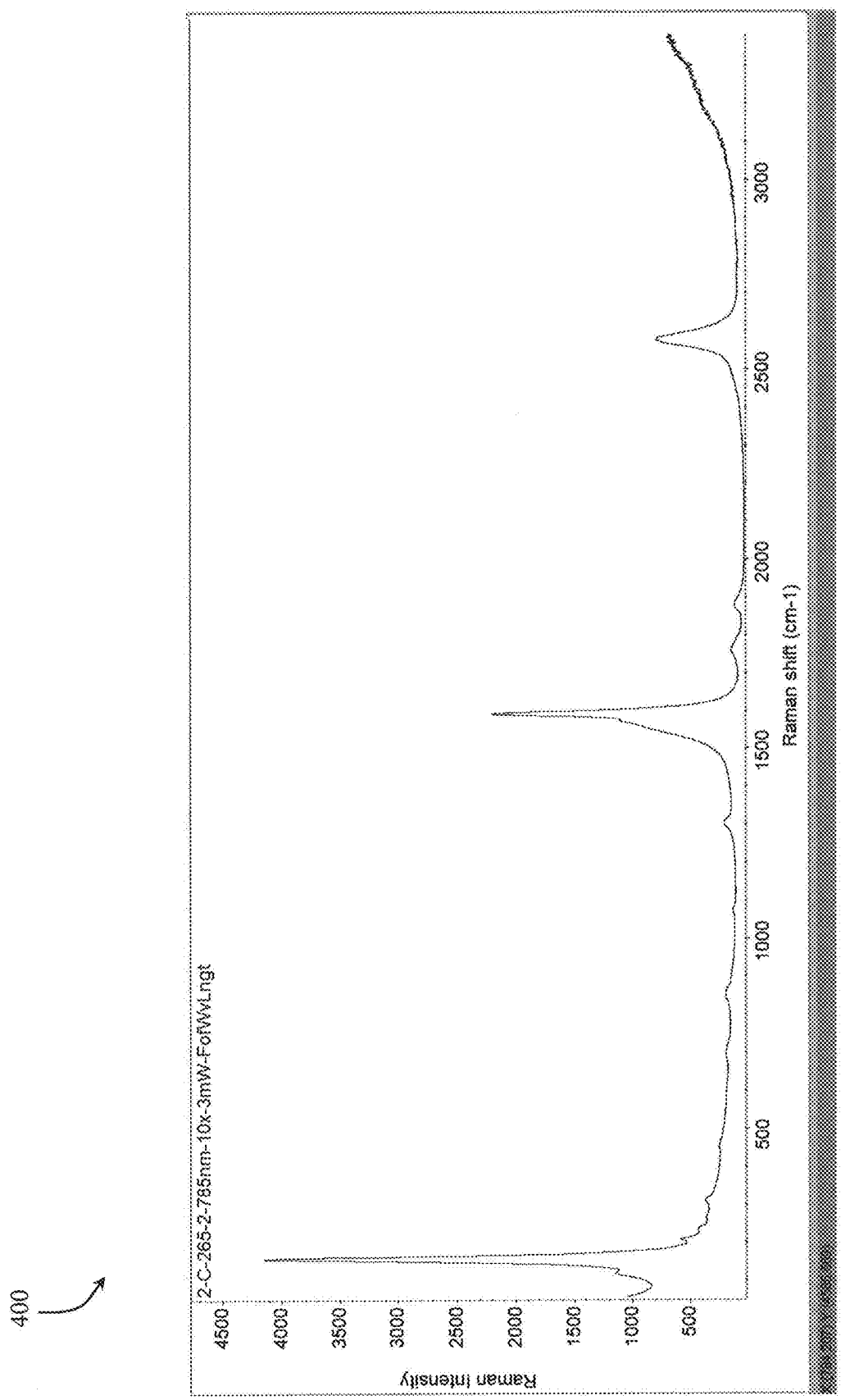
FIG. 4 is a chart showing a Raman spectrum of a quantum armchair batch of tubes.

Referring to FIG. 4 a chart 400 showing Raman spectrum results for a quantum armchair batch of CNTs. The spectrum in chart 400 shows measurement results from a resonance at the 785 nm laser illumination. Chart 400 shows a peak towering above the G band, which corresponds to the wavenumber at which (12,12) nanotubes are found. The FIG. 4 shows a small population of other tubes that are indexed in low volumes. More specifically, the abundance of nanotubes of a given type is related to their intensity in a complex manner. However, there is evidence suggesting a correlation between RBM (radial breathing mode) peak height and relative abundance. Based on the remarkably tall armchair RBM peak at 785 nm, this leads us to believe that other chiralities are present in only minority quantities with the preponderance of tubes being (12,12). The results provided in chart 400 are similar to the results obtained from multiple sample batches of CNTs fabricated utilizing the process of the present disclosure which have been observed to exhibit essentially the same spectra. Therefore, the resulting CNT material most likely contains a preponderance of (12,12) armchairs. There is no indication that traditional methods and systems can achieve mass production or uniformity of armchair CNTs within a single batch or from batch to batch as provided herein. FIG. 4 depicts that almost all the tubes we are making are (12,12).

Figure 5:
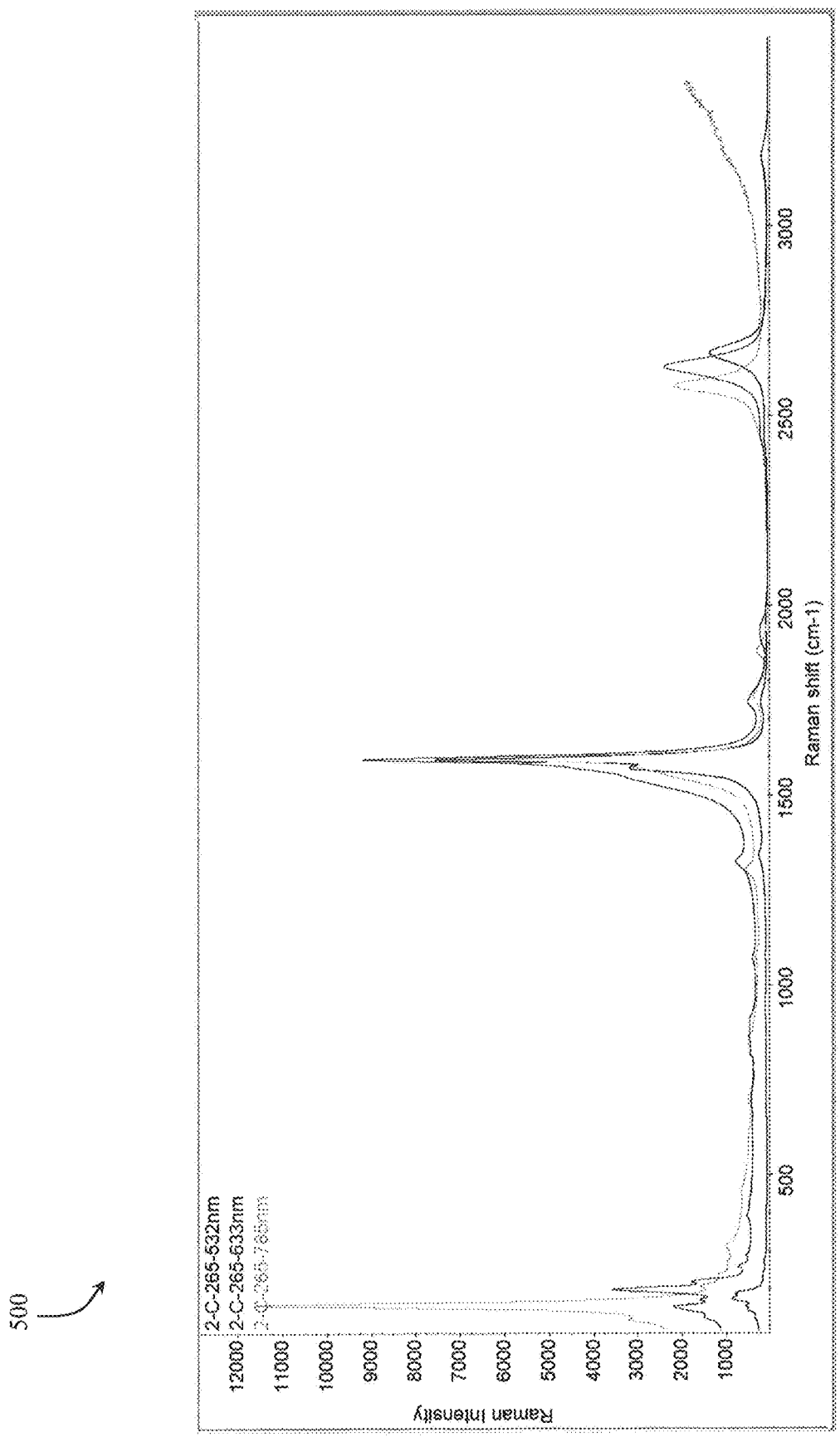
FIG. 5 is a chart showing same specimen illuminated by lasers of different frequency.

Referring to FIG. 5, the specimen utilized in FIG. 4 illuminated by lasers of different frequency (532 nm and 632.8 nm) is depicted, such that other chiralities, if present, would appear if in resonance. As shown in the results of FIG. 5, the (12,12) tubes at ~152 wavenumbers are the most dominant contributors in this lot. Continuing with FIGS. 4 and 5, the peak near 1580 is the G band and the peak near 2600 the G' band. The rising lines above 3000 are typical background lines and do not result from resonance scattering.

Figure 6A:
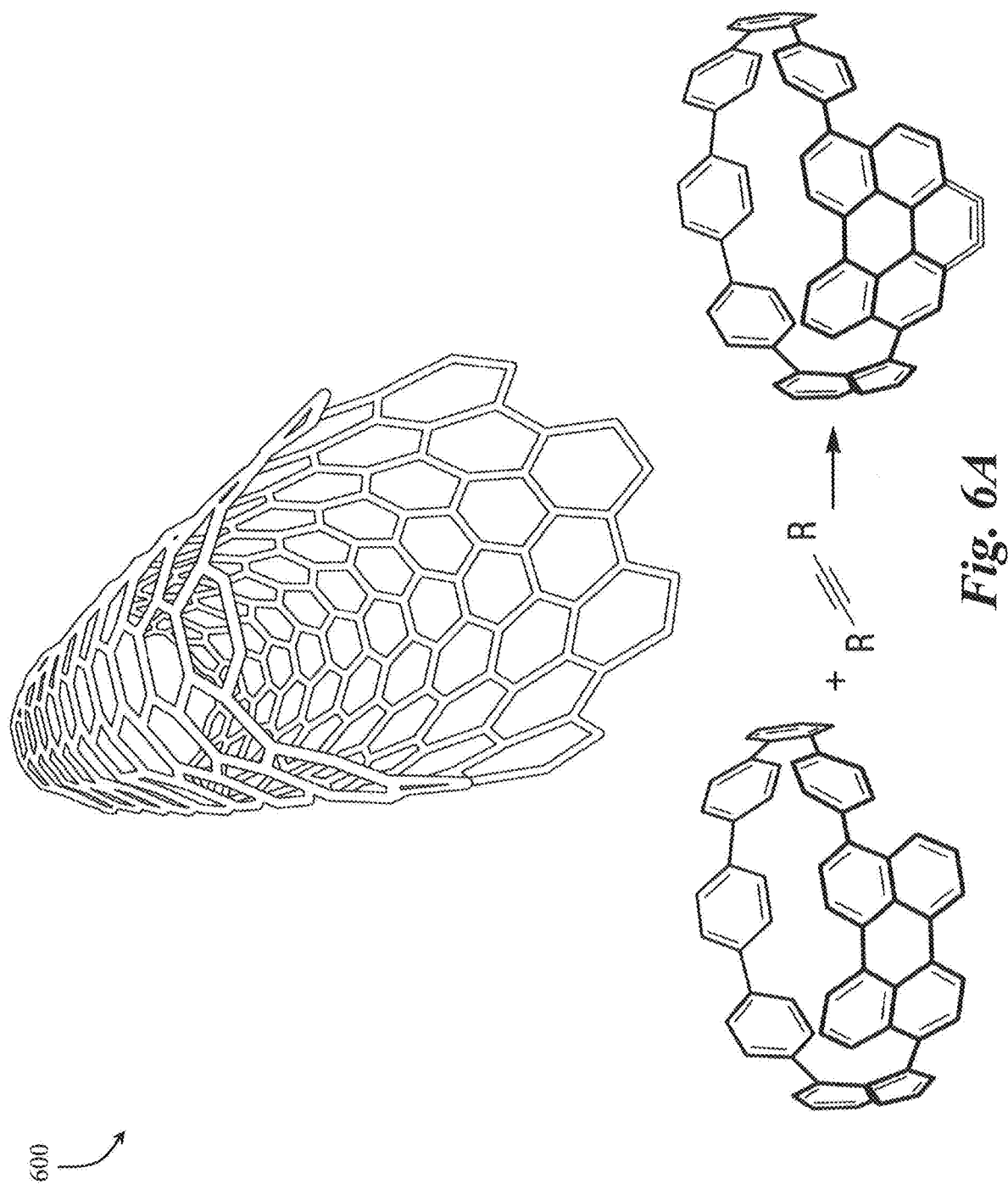
FIG. 6A is a model of nanotube growth by a Diels-Alder reaction addition of a carbon radical.
Figure 6B:
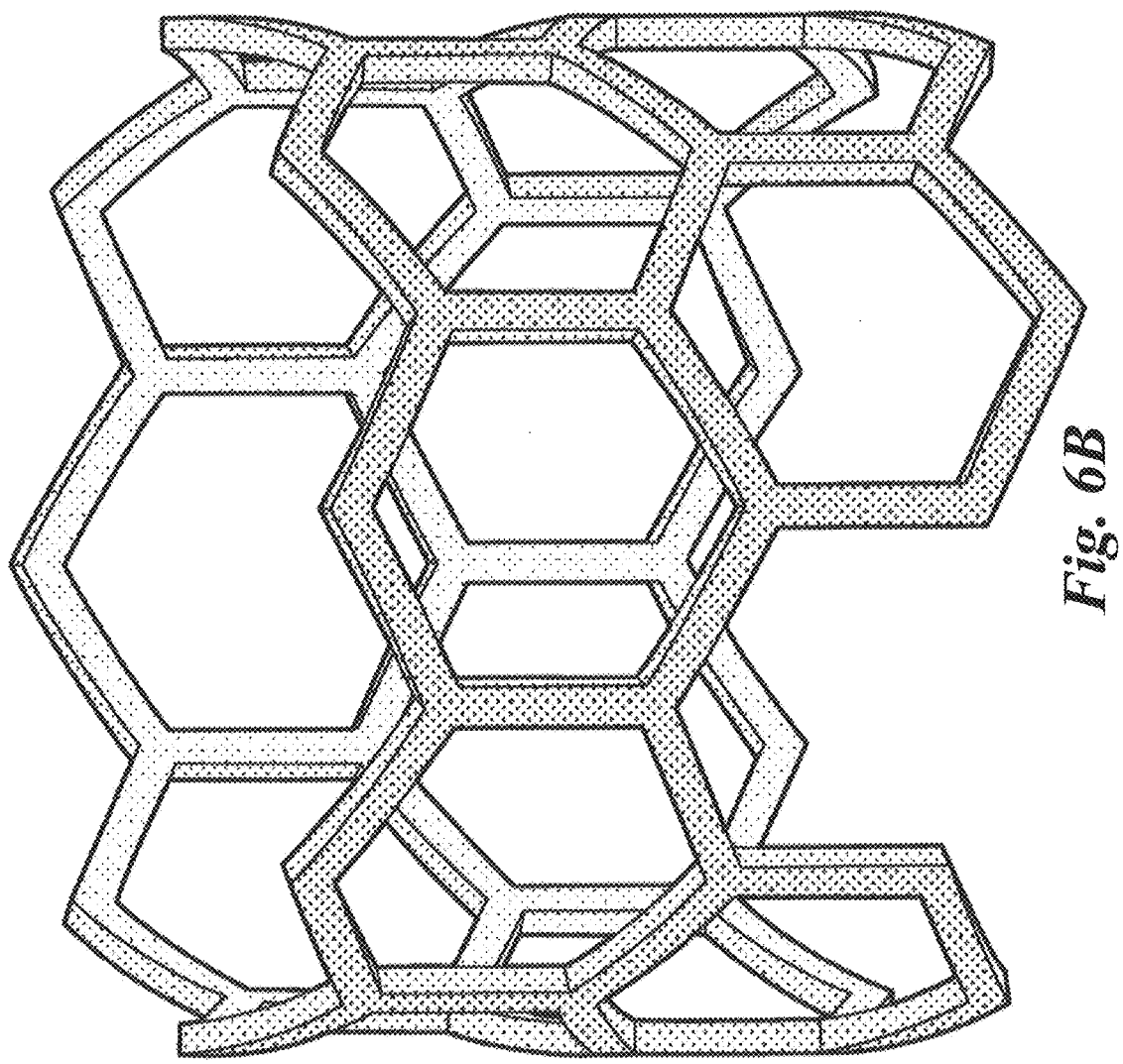
FIG. 6B is a portion of a 6-membered ring of a zigzag CNT.

FIGS. 6A and 6B depict the growth end of the nanotube without the catalyst present. More specifically, FIGS. 6A and 6B depict how an ethylene group or radical is attached exactly to the armchair site to form a long tube. This growth mechanism only requires ethylene groups to be present for an armchair nanotube to grow (refer to FIG. 6A), whereas for other growth chiralities, such as the zigzag nanotube in FIG. 6B, a variety of carbon reactants such as propene groups would need to be present. It is noted that while an armchair nanotube would normally include a cap on the end of the nanotube, for clarity, only the front portion of the ring is depicted.

Referring to FIG. 6A, a known model of nanotube growth by a Diels-Alder addition reaction of a carbon radical, such as an ethylene group to the end of an armchair CNT 600 is depicted. This type of CNT growth by cycloaddition of ethylene or ethylene reactants shows that it is possible and that it is a promising approach for growing nanotubes with predefined chirality. In some embodiments, the zigzag CNT 600 can be created by providing, into the reactor, a carbon source having a high concentration in ethylene or ethylene groups, and providing, into the reactor, a high atomic ratio of hydrogen to carbon to passivate all non-armchair growth sites. The combination of the catalyst, the carbon source, and the high atomic ratio of hydrogen produces conditions to create the volume of nanotubes of the preselected chirality Referring to FIG. 6B, a zigzag CNT 650 is depicted. Growth by addition to the end (bottom in the figure) of the CNT would require methylene or propene groups to complete a 6-membered ring. The [4+2] cycloaddition shown in FIG. 6A is therefore not possible in this case. In some embodiments, the zigzag CNT 650 can be created by providing, into a reactor, a catalyst having a diameter corresponding to a diameter of the preselected chirality, providing, into the reactor, a carbon source having a high concentration in propene or propene groups, and providing, into the reactor, a low atomic ratio of hydrogen to carbon to allow non-armchair growth sites. The combination of the catalyst, the carbon source, and the low atomic ratio of hydrogen produces conditions to create the volume of the zigzag nanotubes of a preselected chirality. FIGS. 6A and 6B show an alternative method of achieving chirality controlled growth.

EXAMPLES

The following examples were performed in accordance with an embodiment of the present disclosure. The examples are provided for example purposes only and are not intended to limit the invention to any implementations. The below parameters were used and successfully repeated these experiments on one system and on a very different second system with a much shorter hot zone and with different fuel type variations.

Example I (Acetylacetonate)

1. Operator: One
2. No. 2-C-243 (265)

3. Fuel: acetylacetonate, $C_5H_7O_2$
4. 3% Thiophene
5. 3% Ferrocene

Example II (Ethanol Experiment)

1. Operator: Two
2. No. 3-C-0078
3. Fuel: ethanol
4. 1.5% Thiophene
5. 1.5% Ferrocene The above examples are experiments that were performed to show how different fuel or carbons sources can be utilized with the present disclosure to provide a volume of nanotubes of a preselected chirality, in accordance with the present disclosure. The Raman spectrum of a quantum armchair batch of tubes, shown in FIG. 4, is provided as proof that the results of the experiments created volume of nanotubes of a preselected chirality. In particular, the data provided in FIG. 4 suggests that the CNTs fabricated using the systems and methods of the present disclosure, resulting from the above-noted examples, were substantially all (12, 12) chirality armchair nanotubes.

As utilized herein, the terms "comprises" and "comprising" are intended to be construed as being inclusive, not exclusive. As utilized herein, the terms "example", "example", and "illustrative", are intended to mean "serving as an example, instance, or illustration" and should not be construed as indicating, or not indicating, a preferred or advantageous configuration relative to other configurations. As utilized herein, the terms "about", "generally", and "approximately" are intended to cover variations that may exist in the upper and lower limits of the ranges of subjective or objective values, such as variations in properties, parameters, sizes, and dimensions. In one non-limiting example, the terms "about", "generally", and "approximately" mean at, or plus 10 percent or less, or minus 10 percent or less. In one non-limiting example, the terms "about", "generally", and "approximately" mean sufficiently close to be deemed by one of skill in the art in the relevant field to be included. As utilized herein, the term "substantially" refers to the complete or nearly complete extent or degree of an action, characteristic, property, state, structure, item, or result, as would be appreciated by one of skill in the art. For example, an object that is "substantially" circular would mean that the object is either completely a circle to mathematically determinable limits, or nearly a circle as would be recognized or understood by one of skill in the art. The exact allowable degree of deviation from absolute completeness may in some instances depend on the specific context. However, in general, the nearness of completion will be so as to have the same overall result as if absolute and total completion were achieved or obtained. The use of "substantially" is equally applicable when utilized in a negative connotation to refer to the complete or near complete lack of an action, characteristic, property, state, structure, item, or result, as would be appreciated by one of skill in the art.

Numerous modifications and alternative embodiments of the present disclosure will be apparent to those skilled in the art in view of the foregoing description. Accordingly, this description is to be construed as illustrative only and is for the purpose of teaching those skilled in the art the best mode for carrying out the present disclosure. Details of the structure may vary substantially without departing from the spirit of the present disclosure, and exclusive use of all modifications that come within the scope of the appended claims is reserved. Within this specification embodiments have been described in a way which enables a clear and concise specification to be written, but it is intended and will be appreciated that embodiments may be variously combined or separated without parting from the invention. It is intended that the present disclosure be limited only to the extent required by the appended claims and the applicable rules of law.

It is also to be understood that the following claims are to cover all generic and specific features of the invention described herein, and all statements of the scope of the invention which, as a matter of language, might be said to fall therebetween.

What is claimed is:

1. A method for synthesizing nanotubes of a preselected chirality, the method comprising:
   introducing a carbon source into a reactor in the presence of a flowing volume of a catalyst having a diameter corresponding to a diameter of the preselected chirality;
   allowing the carbon source to decompose to its atomic constituent to allow attachment of the atomic constituent to the flowing volume of the catalyst for subsequent growth of carbon nanotubes on the flowing volume of the catalyst; and
   injecting, into the reactor, an atomic ratio of hydrogen to carbon, where the atomic ratio is greater than, or equal to, about 10/1, subsequent to the attachment of the atomic constituent to the flowing volume of the catalyst to passivate non-armchair growth sites on the carbon nanotubes, so that a volume of carbon nanotubes of the preselected chirality can be synthesized.

2. The method of claim 1, wherein the carbon source has a high concentration in ethylene or ethylene groups.

3. The method of claim 1, wherein the step of introducing includes tuning a growth process for the catalyst to yield a desired catalyst diameter.

4. The method of claim 1, wherein the high atomic ratio of hydrogen to carbon is larger than 10/1.

5. The method of claim 1, wherein the volume of nanotubes of the preselected chirality is predominantly nanotubes of one of (9,9), (10,10), (11,11), (12,12), or (13,13) chiralities.

6. The method of claim 1, further comprises yarn spinning, by a yoke spinner, the volume of nanotubes of the preselected chirality into a continuous wire of nanotubes of the preselected chirality over 100 m long.

7. The method of claim 1, further comprises growing the nanotubes at a temperature in the reactor between 1200° C. and 1350° C., preferably 1260° C. to 1290° C.

8. The method of claim 1, wherein the diameter of the preselected chirality ranges from 0.4 nanometers (nm) to 3 nm by tuning of growth parameters by stopping the catalyst from growing beyond a desired diameter by controlling temperature, or by adding either oxygen, sulfur or carbon, or combinations of these, to the growing catalyst at a correct growth stage.

9. The method of claim 1, wherein the volume of nanotubes of the preselected chirality is a forest consisting of substantially all nanotubes of the preselected chirality.

10. The method of claim 1, further comprises pulling the volume of nanotubes of the preselected chirality into a tape or sheet.

11. The method of claim 1, wherein the carbon source produces ethylene byproducts when heated and is usually taken from a group containing at least one of acetylacetone, acetone, ethyl alcohol, toluene, ethane, ethylene gas, propanol, n-hexane, methane, benzene, methyl benzene, butane, benzyl alcohol, and natural gas.

12. A method for synthesizing zigzag nanotubes of a preselected chirality, the method comprising:
- introducing a carbon source into a reactor in the presence of a flowing volume of a catalyst having a diameter corresponding to a diameter of the preselected chirality;
- allowing the carbon source to decompose to its atomic constituent to allow attachment of the atomic constituent to the flowing volume of the catalyst for subsequent growth of the zigzag nanotubes on the flowing volume of the catalyst; and
- injecting, into the reactor, an atomic ratio of hydrogen to carbon, where the atomic ratio is less than about 10/1, subsequent to the attachment of the atomic constituent to the flowing volume of the catalyst so as to minimize the formation of extraneous carbonaceous material while still allowing growth sites on the zigzag nanotubes to remain active, so that a volume of the zigzag nanotubes of the preselected chirality can be synthesized.

13. The method of claim 12, wherein the carbon source has a high concentration in propene or propene groups.

\* \* \* \* \*